United States Patent [19]

Schenck

[11] 3,916,331

[45] Oct. 28, 1975

[54] LOW POWER, HIGH IMPEDANCE, LOW BIAS INPUT CONFIGURATION

[75] Inventor: Stephen Robert Schenck, Dallas, Tex.

[73] Assignee: Texas Instruments Incorporated, Dallas, Tex.

[22] Filed: Dec. 26, 1973

[21] Appl. No.: 427,776

[52] U.S. Cl. .................... 330/30 D; 330/18; 330/19; 330/22

[51] Int. Cl.$^2$ .................... H03F 3/68

[58] Field of Search ......... 330/19, 22, 30 D, 18, 25, 330/17

[56] References Cited

UNITED STATES PATENTS

| | | | |
|---|---|---|---|
| 3,586,987 | 6/1971 | Fullagar | 330/22 |
| 3,622,903 | 11/1971 | Steckler | 330/30 D |
| 3,649,926 | 3/1972 | Hill | 330/30 D |
| 3,714,600 | 1/1973 | Kuijk | 330/19 X |
| 3,835,410 | 9/1974 | Wittlinger | 330/19 |

*Primary Examiner*—R. V. Rolinec
*Assistant Examiner*—Lawrence J. Dahl
*Attorney, Agent, or Firm*—Harold Levine; James T. Comfort; James O. Dixon

[57] ABSTRACT

An improved differential amplifier which includes a low power, high impedance, low current input configuration and a bias current selection circuit. In the input configuration two bi-polar transistors are arranged in series, with the input node provided into the base of one of these transistors. A Wilson current source is connected between the base of the input transistor and the transistor in series therewith to sense the base current of the series transistor and provides an equal current to the base of the input transistor thereby resulting in an input bias current at the input node which is essentially equal to zero. The bias current selection circuit senses a large differential input and increases bias current in response thereto to permit fast slewing.

4 Claims, 4 Drawing Figures

LOW POWER, HIGH IMPEDANCE, LOW BIAS INPUT CONFIGURATION

BACKGROUND OF THE INVENTION

This invention relates to amplifiers in general and more particularly such an amplifier having an improved input configuration and a bias current selection circuit.

The desirability of low power, high impedance, low bias current input configurations is well known in the art. Such arrangements are particularly important at the inputs to differential amplifiers and the like. Ideally, the input current in such an arrangement should be zero so that the effective impendance is infinite. However, despite various attempts to achieve this ideal, typical input stages have an input bias current flowing therein resulting in voltages being generated which can cause inaccuracies. For example, when used in differential amplifiers, such currents can result in unbalanced conditions between the input terminals.

Various input configurations have been developed to avoid these problems. A number of these are discussed in application Ser. No. 309,314 filed on Nov. 14, 1972 and assigned to the same assignee as the present invention. As noted therein, current cancelling circuits are discussed in Tobey etal, *Operational Amplifiers, Design and Applications*, Mc Graw-Hill 1971 pages 67 to 78. The circuit described in the above identified application shows one manner of solving this problem using a transistor having at least two output terminals for supplying the input bias current. Although this circuit and other circuits which have been previously developed do result in improved performance, there is still need for better input configurations which come closer to approaching the ideal.

The problems in designing an amplifier which has low current drain while still providing high slew rates is also recognized. Normally, an amplifier with low bias current during normal operation is incapable of high slew rates while an amplifier designed for high slew rates draws a high bias current at all times.

SUMMARY OF THE INVENTION

The present invention provides a differential amplifier with an improved input configuration which avoids the above noted problems and a bias current selector circuit which permits normal operation at low bias current while still providing high slew rates. The input configuration used in the differential amplifier of the present invention may also be used in other devices wherein high impedance and low bias current are requirements. Essentially, the input configuration of the present circuit comprises two bi-polar transistors in series, one of which has its base coupled to the input node. A Wilson current source senses the base current at the second transistor and provides a bias current to the input transistor equal to the sensed current. Thereby, as long as the Wilson current source is set up to have a gain of one, all bias current is provided to the input transistor from the Wilson current source and the input current becomes zero. The circuit is particularly useful in devices employing vertical bipolar transistors, although it may also be used with lateral bipolar transistors and other types of construction.

The Wilson current source is described in an article entitled "A Monothic Junction FET-NPN Operational Amplifier" by George R. Wilson published in the IEEE Journal of Solid-State Circuits, volume SC-3 No. 4 Dec. 19, 1968. It is disclosed therein for use as a current source in operational amplifiers and the like. However, its use in an input confifguration to provide the advantages of low bias current and high input impedance has not previously been recognized.

The bias current selection circuit of the present invention includes a sensing circuit for sensing a high differential input. In response thereto, means are provided to increase bias current temporarily to increase slewing capability.

DETAILED DESCRIPTION OF THE PREFERRED EMBODIMENT

Figure 1:
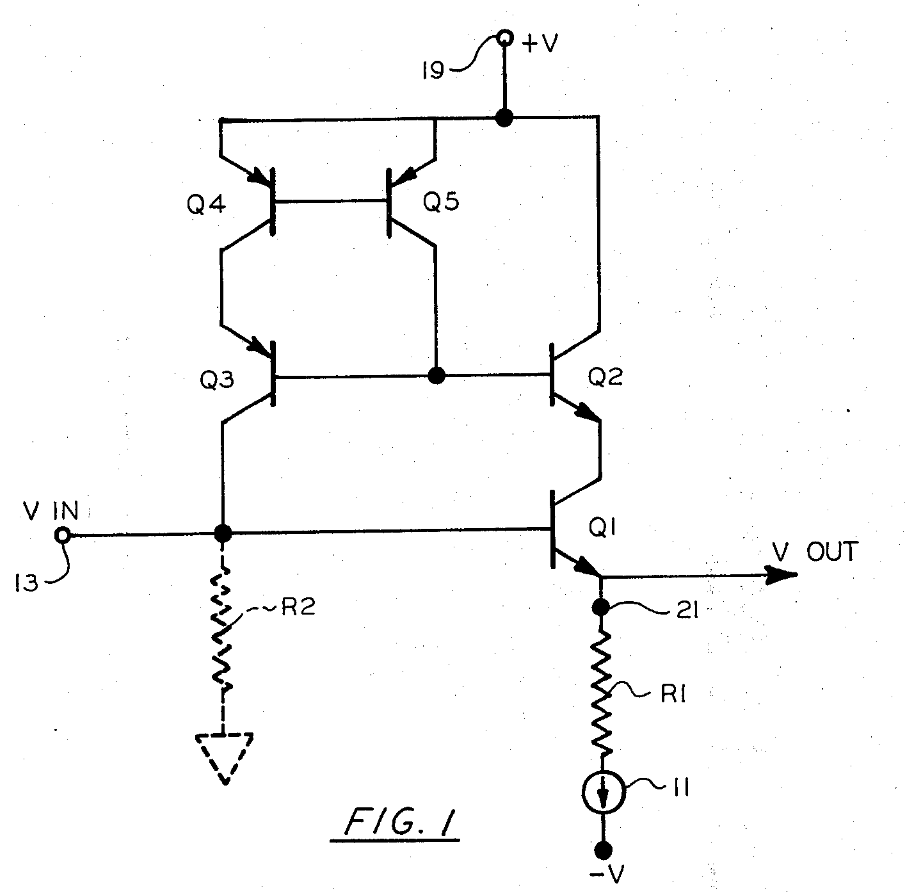
FIG. 1 is a circuit diagram illustrating the input configuration of the present invention.

As illustrated by FIG. 1, an input transistor Q1 has in series therewith a second transistor Q2. In the embodiment shown, these are NPN transistors. The series circuit has the collector of Q2 connected to the positive voltage, the emitter Q2 coupled to the collector Q1, and the emitter of Q1 coupled through a resistor R1 to a current source 11 which is coupled to the negative voltage. Transistors Q1 and Q2 are selected to be matched transistors of equal current gain and low common emitter output conductance. This is required to prevent degrading effects as the result of base width modulation. Such will occur if the $V_{CB}$ of Q2 and Q1 are different. The base of Q2 is the input to a Wilson current source comprising the transistors Q3, Q4 and Q5. These PNP transistors are arranged so that the Wilson current source will have a gain of one. Transistors Q4 and Q5 should be matched to have the same current gain and $V_{BE}$. Under these circumstances, the Wilson current source will provide an output current at the collector of Q3 which is nearly equal to the base current of Q2. This will result in essentially all of the bias current being provided to Q1 from Q3 so that the input current at the node 13 is nearly zero. Although transistors Q1 and Q2 are shown as NPN transistors and Q3, Q4 and Q5 as PNP transistors, it will be recognized by those skilled in the art that the polarities of each along with the applied voltage may be reversed i.e., Q1 and Q2 may be PNP transistors and Q3, Q4 and Q5 NPN transistors with a negative voltage applied to the collector of Q2. Also as noted above, the circuit lends itself to an implementation with verticle NPN and PNP complementary transistors or vertical NPN and latteral PNP transistors.

Tests with the circuit of FIG. 1 were conducted Transistors Q3, Q4 and Q5 were 2N3808 transistors. Transistors Q1 and Q2 were 2N2919 transistors. Two of the circuits were used as respective positive and negative inputs to an operational amplifier with negative feedback. A resistor R2 of 50 ohms was used to couple the positive input to ground. A DC voltage of 2.7 microvolts was measured at the input indicating a current of 54 na through resistor R1. This represents the current which the circuit will draw, i.e., the difference between total bias current and that supplied by the Wilson current source. The drop across resistor R1 which was a 1K resistor was 113 millivolts, indicating a current of 113 microamperes. These figures illustrate large current gain and low bias current of the circuit. The input bias current is related to the current through R1.

Figure 2:
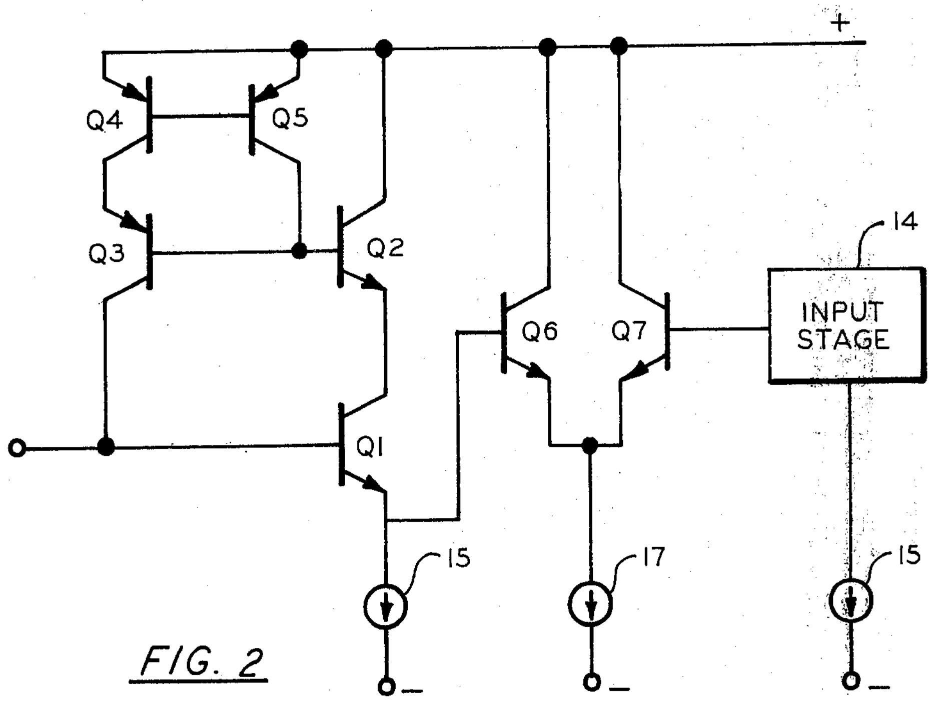
FIG. 2 is a circuit diagram of the input circuit of FIG. 1 in a differential amplifier.

FIG. 2 illustrates an improved operational amplifier circuit in which the above described input circuit may be used. As illustrated, the input stages designed 21 and 23 are constructed according to the embodiment of FIG. 1. The two input stages 21 and 23 are coupled to a first differential stage comprised of the transistors Q6, Q7, Q8, Q9, Q10 and Q11. Input terminals designated N1 and N2 are provided respectively to transistors Q7 and Q11 to provide any necessary offset. The transistors Q17 and Q18, which are controlled by a transistor Q19 to be described below, establish the bias current in the input stages. The transistors Q23, Q24 and Q25 are arranged as a Wilson current source and act as an active load for the input differential stage. Diodes D1 and D3 are used to limit the voltage swing at the input stage.

The output of the first differential stage is provided to a second differential stage comprising the transistors Q47, Q48, Q49 and Q50 in conventional fashion. Bias current for the second differential stage is provided by transistors Q52, Q53 and Q54. These transistors have their base in common with transistor Q19 which controls the transistors Q17 and Q18 which establish bias current at the input. The bias current established by the transistors Q19, Q52, Q53, Q54 and also by Q55 to be described below, is determined by the current flowing in the resistors R4 and R5, which resistors may comprise a single resistor in this embodiment. A current path exists from the positive voltage through transistors Q31 and Q21, the resistors R4 and R5 and Q51 to the negative voltage terminal. Q21 is controlled by the voltage at the junction between a zenner diode D9 and resistor R3 which are in series between the positive and negative voltage. Q21 acts to provide current gain and to maintain a fixed voltage across the resistors R5 and R4, thereby establishing a constant current which determines the biasing of all stages. The transistors Q31 and Q51 which act as diodes in turn establish the currents provided by the transistors Q30 and by the aforementioned Q19, Q52, Q53, and Q55.

The output of the second differential stage is provided to an output stage comprised of the transistors Q35, Q36, Q37, Q38, Q39 and Q40. The second differential stage is similarly loaded by an active load in the form of a Wilson current source and made up of the transistors Q32, Q34 and Q33. The collector of Q34 is coupled to the bases of Q35 and Q36 forming the single ended input of the output state, which as shown has a single ended output. It will be recognized that an amplifier having a differential output may also be used if desired.

Resistor R7, diodes D10 and D11 and transistors Q41 and Q42 are provided in conventional fashion for output short circuit protection. The resistors R1 and R2 are included to lower the gain of the input differential and along with the capacitor C1 help to compensate the circuit. Q43 and Q44 between the emitters of transistors Q37 and Q38 act as diodes for maintaining equal D-C bias and current balance between these two transistors in the output stage.

Figure 3:
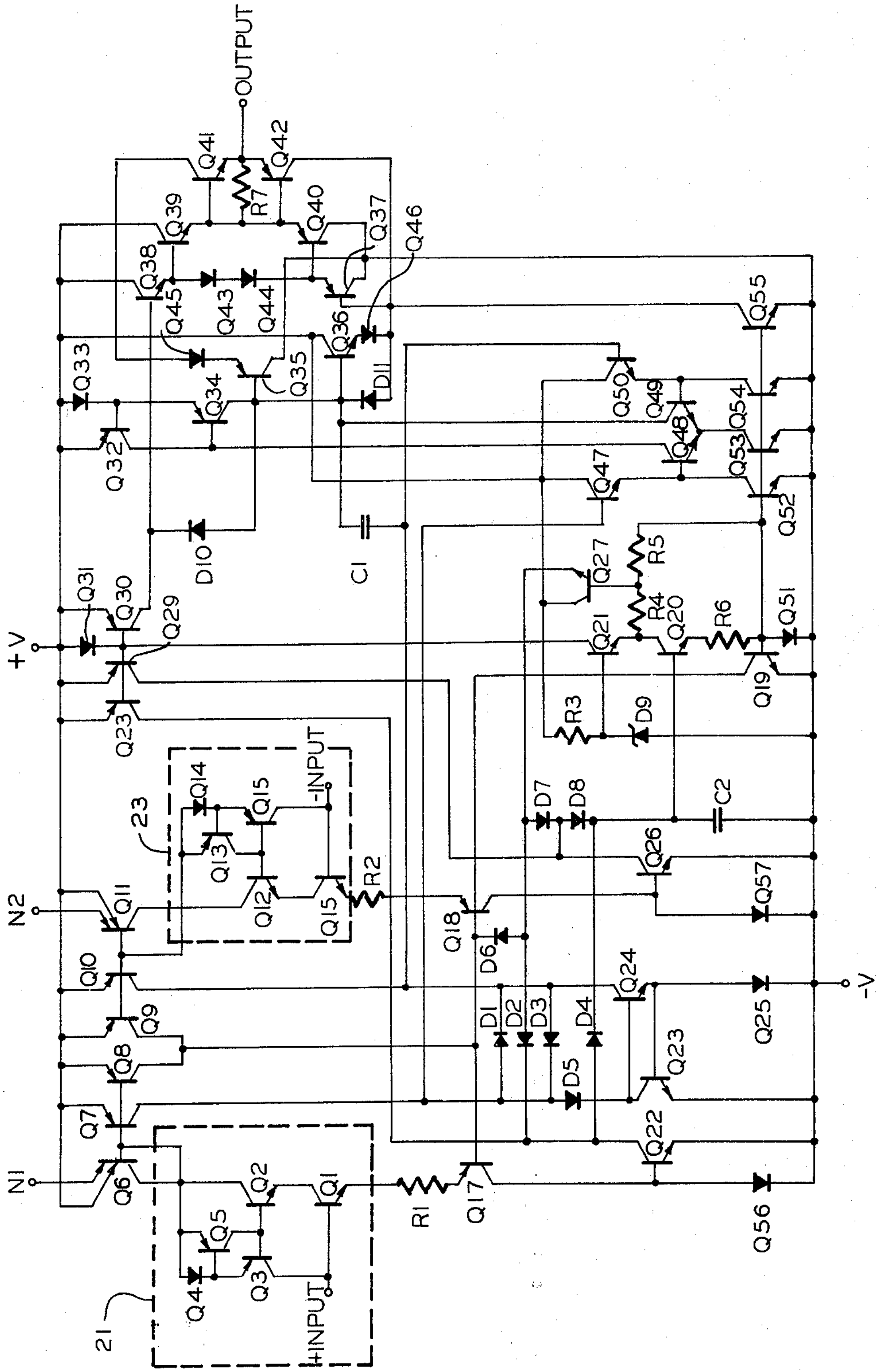
FIG. 3 is the amplifier of FIG. 2 with the bias current selection circuit also installed.

One problem in the design of amplifiers such as that shown on FIG. 2 is that there is a desire to consume as little power as possible but at the same time provide the maximum possible slewing rate. Slewing refers to a condition where the amplifier output must change voltage as fast as possible in response to a large differential voltage input. Normally, the amplifier will be operating with a very small differential input and will require little current. However, in order for the amplifier to change its output very quickly in response to a large differential input, a high bias current is required. Thus, normally an amplifier which has been designed for high slewing rates will always consume large amounts of power. On the other hand, an amplifier designed for low power consumption will not normally have high slewing rates. The circuit shown on FIG. 3 illustrates an operational amplifier essentially the same as that on FIG. 2 but including an improved bias current selection circuit which permits low power consumption during normal operation but still allows high slewing rates.

Normal bias current is established by the selection of the resistors R4 and R5 in the manner described above. Thus, the voltage on the various current source transistors such as Q19, Q52, Q53 and Q54 is controlled as a function of the resistors R4 and R5. Q19 in turn controls the bias current of the transistors Q17 and Q18. The bias current selector of the present invention is comprised of the transistors Q28, Q29, Q20, Q22, Q26, Q56 and Q57, diodes D2, D4, D7 and D8, resistor R6 and capacitor C2. The circuit monitors the bias current in each side of the input differential section by monitoring the bias current from the collectors of Q17 and Q18. The transistors Q56 and Q22 comprise an active load driven at its input by Q17. Similarly, transistors Q26 and Q57 comprise an active load driven at their input by Q18. The outputs of these active loads are coupled respectively to current supply transistors Q28 and Q29. Q28 and Q29 are designed by device size to have a current output which is less than the maximum possible current available from Q22 and Q26. If the voltage between the positive and negative input terminals increases, the current from one of the collectors of Q17 or Q18 will decrease. When it decreases enough such that Q28 or Q29 conducts more than Q22 or Q26, one of these two collectors will experience an increase in voltage. This will result in either diode D8 or D4 being forward biased in turn causing Q20 to conduct. The conduction of Q20 will place the resistor R6 in parallel with the resistors R4 and R5 thereby decreasing the total resistance and increasing the bias current. In the manner described above, this will in turn increase the bias currents in all stages of the amplifier. With this increased bias current, the amplifier is capable of fast slewing. Diodes D6, D2 and D7 are used to prevent saturation in the various transitors. Thus, diode D7 clamps the collector of transistor Q26 preventing its saturation. Similarly, the diode D2 clamps the collector of transistor Q22 preventing it from going into saturation. The diode D6 performs a similar function for the transistors Q17 and Q18. The clamping voltage provided by each of these diodes is established by transistor Q27 which has its base connected at the junction of the resistors R4 and R5 which will have their relative values selected to obtain the desired clamp voltage at the emitter of Q27 in well known fashion.

The voltage differential required for the circuit to go into a slewing mode by increasing the bias current can be selected by the design of the transistors Q28, Q29, Q22 and Q26. As noted above, these transistors set the point at which the current from Q28 or Q29 is greater than the current from Q22 or Q26. After the amplifier has reached a stable state where the input voltage difference approaches zero, neither D4 nor D8 will be forward biased and conducting. The capacitor C2 will then discharge through the base of Q20 causing the bias current to exponentially decrease toward the normal level. Capacitor C2 is required to ensure stability so that bias current cannot decrease too rapidly. The diodes D2 and D7 are provided to prevent Q22 and Q26 from saturating and causing large storage times. A computer model of the circuit of the present invention was constructed with the model being developed as accurately as possible and including all stray and internal capacitances that might be present in an integrated circuit. A bread board was constructed and tested and a computer model of the bread board itself with larger capacitances was constructed. Various data obtained corresponded quite closely. For example, with the amplifier in a closed loop configuration, slew rates in a positive direction of approximately 33 volts per micro second and in the negative direction of 29 volts per micro second were obtained in response to a differential input of approximately 11 volts in 0.1 micro second. In each case, the amplifier had completely settled out less than 1 micro second.

Figure 4:
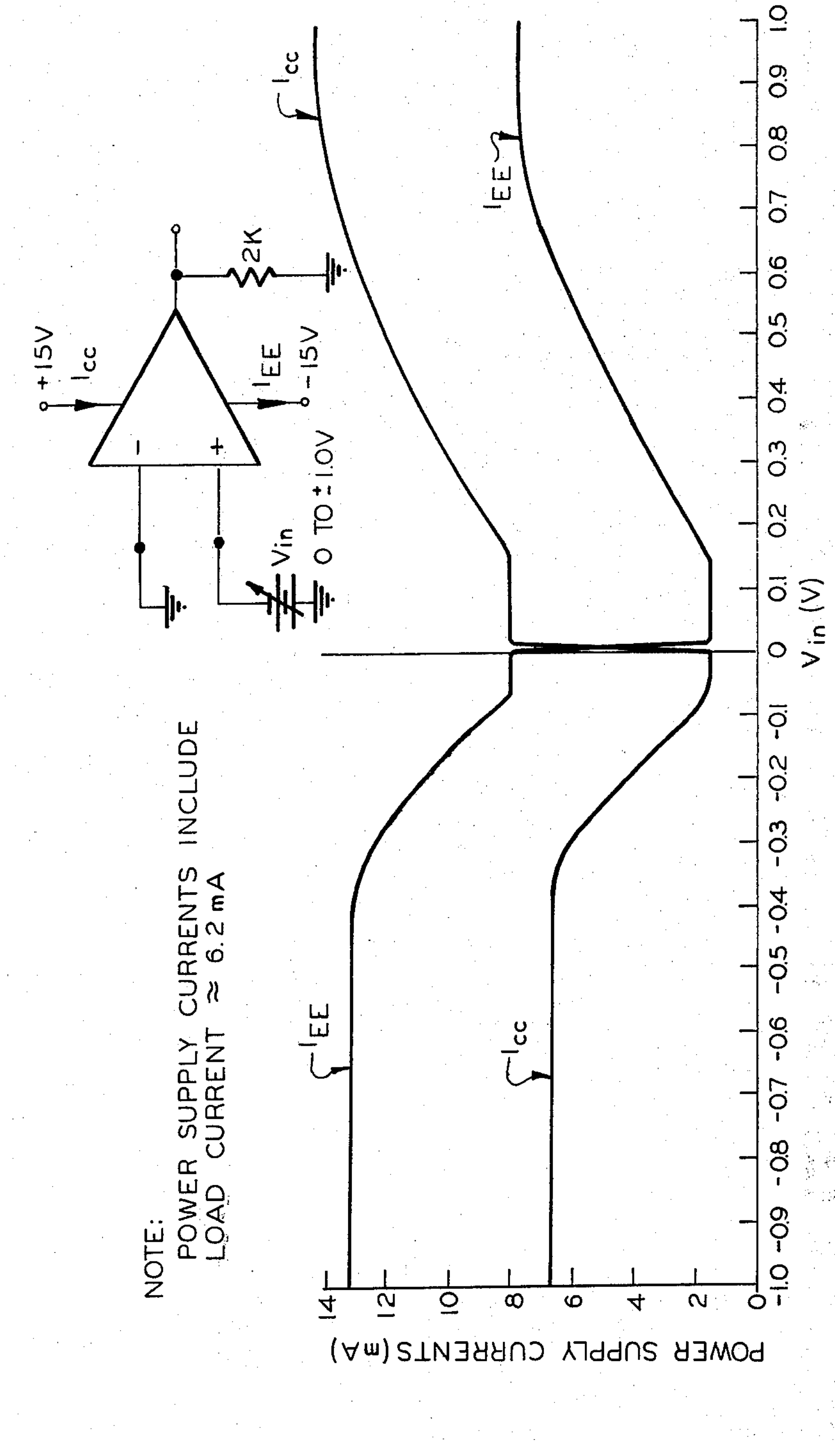
FIG. 4 is a plot of power consumption as a function of differential input voltage, for the amplifier of FIG. 3.

FIG. 4 illustrates the current drain of the present circuit as a function of the differential input voltage. Along with the curve, the circuit arrangement used is shown. As illustrated during normal operation with a very small differential input, the positive current $I_{CC}$ is less than 2 milliamps and the negative current $I_{EE}$ less than 2 milliamps. During slewing, these currents increase to about 13 milliamps and 7 milliamps respectively. In order to obtain the slewing rates noted above without a circuit such as the bias current selection circuit of the present invention, the higher current levels would have to be maintained at all times. Thus, the power consumption of the present circuit is greatly reduced during normal operation while still retaining an excellent slewing capability.

Thus, an improved operational amplifier and specifically an improved input stage and a bias current selection circuit therefor have been shown. Although specific embodiments have been illustrated and described, it would be obvious to those skilled in the art that various modifications may be made without departing from the spirit of the invention which is intended to be limited solely by the appended claims.

I claim:

1. An improved differential amplifier comprising:

a. first and second input circuits each comprising:
   - i. a first transistor of one conductivity type having its base connected to the circuit input;
   - ii. a second transistor of the same type having its emitter coupled to the electrode of said first transistors; and
   - iii. circuit means having its input coupled to the base of said second transistor and its output coupled to the base of said first transistor for supplying a bias current to said first transistor substantially equal to the base current of said second transistor;

b. an input differential stage having its two inputs coupled respectively to the outputs of said first and second input circuits;

c. an output stage coupled to said input differential stage;

d. a bias current circuit coupled to each of said input circuits, input differential stage and output stage to establish bias currents therein; and e. means to sense a large differential input voltage and means in said bias current circuit responsive thereto to cause an increase in the bias current in each of said stages.

2. The invention according to claim 1 wherein said means to sense comprise:

a. first and second active loads driven in response to the current in said first and second input circuits;

b. first and second current supplies coupled to said first and second current sources, driven by said bias control circuit and designed so as to have a fixed maximum current output which is less than the maximum current which may flow in said first and second active loads;

c. first and second means to sense a condition where the current from said current supplies is greater than the current being demanded by its associated current source and to provide an output indicative thereof, said means to increase bias current being responsive to said output.

3. The invention according to claim 1 wherein said bias current circuit includes a first resistor having a fixed voltage applied thereto with the current therethrough establishing the bias current and said means to increase comprise:

a) a second resistor; and b) means responsive to said output to cause said resistor to establish a current which is added to said current through said first resistor.

4. The invention according to claim 3 wherein said first and second means to sense comprise first and second diodes coupled to the point of coupling between said first and second active loads and said first and second current supplies, said diodes providing said output and said means responsive to said output comprises a transistor having its base coupled to said diodes and said second resistor in its emitter collector path.

* * * * *